United States Patent
Shimoaka

(10) Patent No.: US 7,378,296 B2
(45) Date of Patent: May 27, 2008

(54) PRINT MASK AND METHOD OF MANUFACTURING ELECTRONIC COMPONENTS USING THE SAME

(75) Inventor: Yoshio Shimoaka, Aira-gun (JP)

(73) Assignee: Kyocera Corporation, Kyoto (JP)

( * ) Notice: Subject to any disclaimer, the term of this patent is extended or adjusted under 35 U.S.C. 154(b) by 433 days.

(21) Appl. No.: 10/786,890

(22) Filed: Feb. 25, 2004

(65) Prior Publication Data

US 2004/0191956 A1    Sep. 30, 2004

(30) Foreign Application Priority Data

Feb. 25, 2003 (JP) ............ P 2003-047503
Jul. 30, 2003 (JP) ............ P 2003-204168

(51) Int. Cl.
  H01L 21/44   (2006.01)
  H01L 21/48   (2006.01)
  H01L 21/50   (2006.01)
(52) U.S. Cl. ............ 438/108; 438/613; 438/612
(58) Field of Classification Search ............ 438/108, 438/613, 612; 216/12, 41, 44–45
  See application file for complete search history.

(56) References Cited

U.S. PATENT DOCUMENTS

2006/0237225 A1 * 10/2006 Kariya et al. ............ 174/260

FOREIGN PATENT DOCUMENTS

| JP | 52-068366 | 6/1977 |
|----|-----------|--------|
| JP | 04-043087 | 2/1992 |
| JP | 04-237187 | 8/1992 |
| JP | 06-140409 | 5/1994 |
| JP | 06-168949 | 6/1994 |
| JP | 06-267964 | 9/1994 |
| JP | 08-264932 | 10/1996 |
| JP | 10-242632 | 9/1998 |
| JP | 11-034524 | 2/1999 |
| JP | 11-340270 | 12/1999 |
| JP | 2000-168027 | 6/2000 |
| JP | 2002-134895 | * 10/2000 |
| JP | 2001-015909 | * 1/2001 |
| JP | 2002-134895 | 5/2002 |
| JP | 2002-211154 | 7/2002 |

* cited by examiner

*Primary Examiner*—Chuong A. Luu
(74) *Attorney, Agent, or Firm*—Hogan & Hartson LLP

(57) ABSTRACT

A print mask is used to form bumps on barrier metal layers of a wafer. The mask comprises a plurality of elongated perforations disposed in a linear arrangement such that paste can be applied to an object to be printed on via the perforations. Each of the perforations includes an edge disposed along the longitudinal direction, and the edge is inclined with respect to the direction perpendicular to the direction of arranging the perforations.

6 Claims, 8 Drawing Sheets

PRINT MASK AND METHOD OF MANUFACTURING ELECTRONIC COMPONENTS USING THE SAME

BACKGROUND OF THE INVENTION

1. Field of the Invention

The present invention relates to a print mask for screen printing used for printing a printing paste onto a wafer so as to form bumps or protrusion electrodes on barrier metal layers provided on the wafer. The present invention includes a method of electronic components by using the print mask, and relates particularly to a method of manufacturing a flip-chip integrated circuit that is mounted on a circuit board by face-down bonding.

2. Description of the Related Art

Conventional assembling integrated circuits includes face-down bonding method that mounts the integrated circuits on the top surface of a circuit board having a circuit pattern so that circuits forming surface of the integrated circuit face the surface of the circuit board, and connects the integrated circuits and the circuit board by means of leads.

Integrated circuits that are mounted by face-down bonding are called the flip-chip integrated circuit, of which terminals have generally been connected to the circuit pattern of the circuit board by means of solder or an electrically conductive adhesive.

One of the conventional flip-chip integrated circuits has such a constitution as a plurality of barrier metal layers made of nickel or the like are formed as pad electrodes on one of the principal planes of a semiconductor wafer, and electrodes consisting of solder bumps are selectively formed on the barrier metal layers. Assembling of this flip-chip integrated circuit is carried out by positioning the solder bumps of the flip-chip integrated circuit on the pad electrodes so as to oppose the corresponding circuit pattern provided on the circuit board, mounting the flip-chip integrated circuit on the circuit board and heating the solder bumps to a high temperature so as to melt, thereby soldering the barrier metal layers of the flip-chip integrated circuit onto the circuit pattern provided on the circuit board.

Such a flip-chip integrated circuit is usually manufactured in a process as described below (refer to FIG. 4 through FIG. 6).

(1) A semiconductor wafer 11 is prepared so that a plurality of barrier metal layers 13 are disposed in linear arrangement on the integrated circuit forming surface of the semiconductor wafer, circuit pattern lines 12 are provided between adjacent barrier metal layers 13, and covering the circuit pattern lines 12 with passivation layer 14. The circuit pattern lines 12 function as power feeder wires that supply electric power and electrical signals to the semiconductor elements formed on the semiconductor wafer 11, and are usually formed from a metallic material such as aluminum in a pattern line perpendicular to the direction of arranging the barrier metal layers 13.

(2) A print mask 16 is prepared, the print mask having a plurality of elongated perforations 17, which are larger than the outer diameter of the barrier metal layers, formed in one-to-one correspondence to the barrier metal layers 13.

(3) The print mask 16 is placed on or above the semiconductor wafer 11, so that the perforations 17 are positioned on or above the barrier metal layers 13.

(4) A solder paste 15 is supplied onto the print mask 16, a squeegee is pressed against the print mask 16 to move the solder paste in a predetermined direction, so as to print the solder paste 15 via the perforations 17 onto the barrier metal layers 13.

(5) The semiconductor wafer is heated so as to melt the solder paste 15 that has been applied, thereby to form spherical solder bumps on the barrier metal layers 13. By dicing the semiconductor wafer 11 into chips of predetermined shape, a number of flip-chip integrated circuits are completed.

The elongated perforations 17 are disposed in linear arrangement in the print mask 16, while the edges of the perforations 17 along longitudinal direction thereof are disposed perpendicular to the direction of the row of perforations 17. This means that, when the print mask 16 is placed on or above the semiconductor wafer 11, the edges of the perforations 17 are disposed substantially in parallel to the circuit pattern lines provided between the adjacent barrier metal layers 13 (refer to FIG. 4).

It has been known to form a plurality of rows of perforations 17a, 17b, 17c by disposing a number of perforation 17 in linear arrangement on a mask sheet 8 that is made of stainless steel or the like as shown in FIG. 10, so as to form solder bumps for flip-chip ICs by using the mask for screen printing. In this example, the perforation 17 that constitute three rows of perforations 17a, 17b, 17c are disposed with a density which is predetermined for each row of the perforations in correspondence to the barrier metal layers provided on the silicon substrate, while the opening area is made substantially equal among the rows of perforations 17a, 17b, 17c.

The circuit pattern lines 12 provided between the adjacent barrier metal layers 13 on the semiconductor wafer 11 have predetermined thickness (for example, 0.5 to 1.5 μm), and the passivation layer 14 that covers the circuit pattern lines 12 is provided with protrusions 14a or steps formed on the surface thereof so as to protrude in a configuration corresponding to the thickness and profile of the circuit pattern lines 12. When the print mask 16 is placed on or above the semiconductor wafer 11 having such protrusions 14a, the edges of the perforations along longitudinal direction thereof are often positioned on corners located at the bases of the protrusions 14a of the passivation layer 14. Squeezing the print mask 16 so as to press against the semiconductor wafer 11 under this conditions causes the edges of the perforations 17 to collide against into the corner, resulting in damage on the surface of the passivation layer 14 (refer to FIG. 5, FIG. 6). This gives rise to the possibility of degrading the sealing performance of the passivation layer 14, which leads to corrosion of the circuit pattern lines 12 due to moisture in the atmosphere or other causes. This problem has been conspicuous in such a case as the edges of the perforations 17 along longitudinal direction thereof is straight.

In a print mask of the configuration shown in FIG. 10, when solder paste placed on the mask is moved by a squeegee over a certain distance, the solder paste located on the mask in the vicinity of the row of perforations 17a having a high density of arrangement of the perforations 17 experiences flow-out onto the barrier metal layers a larger number of times than the solder paste located on the mask in the vicinity of the rows of perforations 17b and 17c where the density of perforations is lower than that of the row of perforations 17a. Such a frequent flow-out of the solder paste causes vigorous rotation and flow of the solder paste itself on the mask, which tend to make the viscosity of the solder paste located in the vicinity of the row of perforations 17a lower than that of the solder paste located in the vicinity of other rows of perforations.

As a result, there has been such a problem that the quantity of solder paste 50 applied onto the barrier metal layers tends to be larger in the row of perforations 17a than in the rows of perforations 17b and 17c, thus generating variations in the size of the solder bumps. The side variations of the solder bumps results in a decrease in the strength of boarding the flip-chip ICs on the circuit board due to tilting of those ICs when mounting the those ICs on the circuit board.

SUMMARY OF THE INVENTION

An object of the present invention is to provide a print mask capable of effectively preventing the surface of a passivation layer from being damaged during printing of paste, and to provide a method of manufacturing a flip-chip integrated circuit without causing damage on the surface of the passivation layer by using the print mask.

Another object of the present invention is to provide a high quality mask for screen printing capable of forming bumps of substantially the same sizes and a method of manufacturing electronic components by using the mask for screen printing.

According to the present invention, the print mask comprising a plurality of elongated perforations arranged therein is used for applying a paste via the perforations onto an object to be printed, wherein the edges of the perforations along the longitudinal direction thereof is inclined with respect to the direction perpendicular to the direction of arranging the perforations.

The angle of inclination of the perforations mask is preferably such that the edges of the perforations along the longitudinal direction thereof is inclined by an angle from 5 to 45° from the direction perpendicular to the direction of arranging the perforations.

In the print mask of the present invention, the edges of the perforations along the longitudinal direction thereof are preferably straight. Particularly, a print mask having a number of perforations disposed in linear arrangement can be used. Such a print mask can be used widely for manufacturing flip-chip integrated circuits in the field of integrated circuit manufacture.

The method of manufacturing the flip-chip integrated circuit includes the following steps. A plurality of barrier metal layers are arranged planer geometrically on the top surface of a semiconductor wafer, circuit pattern lines are provided between adjacent barrier metal layers, and a passivation layer is formed to cover the circuit pattern lines. A print mask having a number of elongated perforations is prepared in correspondence to the barrier metal layers. In the next process, the perforations of the print mask are placed on or above the barrier metal layers so that the edges of the perforations along the longitudinal direction thereof are inclined against the circuit pattern lines that are provided between the adjacent barrier metal layers. A paste supplied onto the print mask is printed onto the barrier metal layers via the perforations, followed by the formation of bumps by heating the paste applied onto the barrier metal layer.

According to the present invention, since the edges of the perforations along the longitudinal direction thereof is inclined with respect to the direction perpendicular to the direction of arranging the perforations in the print mask having the plurality of elongated perforations disposed therein, the edges of the perforations along the longitudinal direction thereof are disposed so as to be inclined with respect to the circuit pattern lines provided between the barrier metal layers, when the print mask is placed on or above the semiconductor wafer that has the barrier metal layers that correspond to the perforations.

As a result, such a trouble can be prevented from occurring, as the edges of the perforations of the print mask collide against the corners located at the bases of the protrusions of the passivation layer that are formed in correspondence to the configuration of the circuit pattern lines, thereby to cause damage on the surface of the passivation layer, even when the print mask is pressed against the semiconductor wafer during printing of the paste. Thus sealing performance of the passivation layer is satisfactorily maintained and the problems including the erosion of the circuit pattern lines can be solved.

The present invention is particularly effective in case the edges of the perforations along the longitudinal direction thereof are straight.

In another aspect of the present invention, such a print mask is provided as a number of perforations are disposed in a single row or a plurality of rows so as to apply a solder paste via the perforations onto a wafer and form bumps on barrier metal layers provided on the wafer, wherein density of arrangement of the perforations varies depending on the region of arrangement and opening area of perforations is set smaller in a region of arrangement having higher density of arrangement of the perforations.

Preferably, the perforations are disposed in a plurality of rows, and the density of arrangement of the perforations is set individually for each row. The plurality of rows of the perforations are preferably disposed substantially in parallel to each other.

A method of manufacturing electronic components according to another embodiment of the present invention comprises placing a printing paste on the mask for screen printing described above, moving the printing paste in the direction along the row of the perforations so as to apply the printing paste via the perforations onto the barrier metal layers that are located right below the perforations, and forming bumps on the barrier metal layers.

According to the present invention, since the opening area of the perforations formed in the mask for screen printing is made smaller in a region of arrangement having a higher density of arrangement of the perforations, quantity of the printing paste applied onto the barrier metal layers can be made substantially equal for all the perforations, even when viscosity of the printing paste located in the vicinity of a region having a higher density of arrangement of the perforations becomes lower than that of the printing paste located at other portions of the print mask, thus making it possible to provide an electronic component, particularly a flip-chip IC, having high assembling performance by equalizing the sizes of the bumps formed on the barrier metal layers of the electronic component.

PREFERRED EMBODIMENTS OF THE INVENTION

Description of Print Mask

Figure 1:
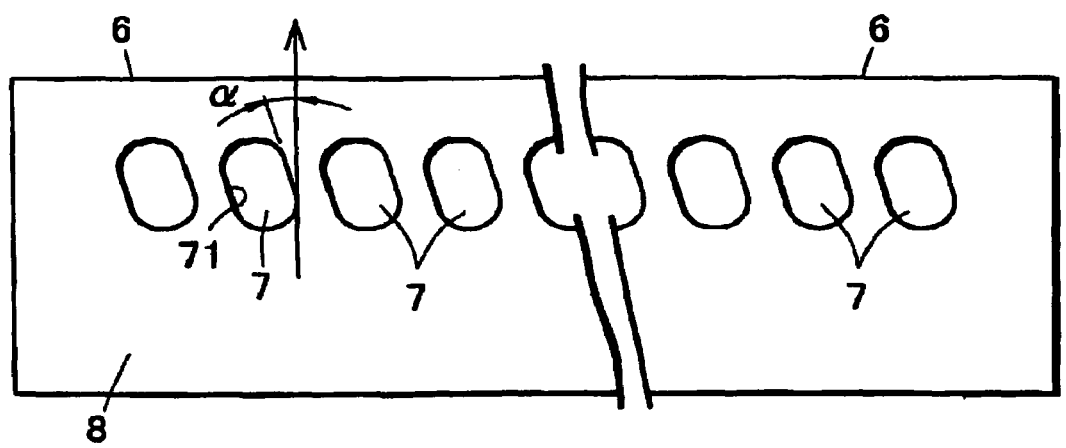
FIG. 1 is a plan view of a print mask according to one embodiment of the present invention.

A print mask 6 of first embodiment of the present invention has such a structure as a number of perforations 7 are arranged in a sheet-like mask body 8 as shown in FIG. 1. The mask body 8 is a thin sheet made of a metallic material, resin or a combination thereof, and usually has a rectangular profile.

The metallic material that makes the mask body 8 may be aluminum alloy, stainless steel, Ni alloy, Cr alloy or the like. The resin material for the mask may be polyimide, polyester, epoxy, polycarbonate, polyethylene, polyethylene terephthalate (PET), polypropylene or the like.

The mask body 8 is formed in a sheet from these materials. The thickness of the sheet is preferably from 20 to 80 µm.

As another example, the mask body may be made of a composite material, such that comprises a wire mesh and a hardened insulating emulsified material applied to the wire mesh and hardened, which is molded into the print mask.

The metal sheet or the wire mesh of the mask body has a number of perforations 7 formed therein in a predetermined pattern. The plurality of perforations 7 formed in the mask body 8 are disposed in a linear arrangement with a density of, for example, 100 to 300 dots per inch, in a single row or a plurality of rows.

The perforations 7 are formed in elongated shape such as elongated ellipse, rectangle or parallelogram, in such a way as the edges 71 of the perforations along the longitudinal direction thereof are disposed in a straight line.

The perforations 7 are through holes that penetrate the mask body 8 in the direction of thickness, through which an electrically conductive paste such as solder paste or silver epoxy placed on the mask body 8 is allowed to pass during printing operation.

Of the mask body 8 comprising the wire mesh described above, areas not covered by the emulsified material are used as the perforations 7.

The perforations 7 preferably have surface roughness of 1.0 µm or less in terms of arithmetic mean roughness Ra on the inner circumference thereof, in order to ensure satisfactory application of the paste onto the object of printing. When the surface roughness Ra is larger than 1.0 µm on the inner circumference of the perforations 7, it is difficult to transfer the paste satisfactorily onto the object of printing, especially in case the perforation 7 has a small area of 10000 µm$^2$ or less. Lower limit of the surface roughness on the inner circumference of the perforations 7 is preferably 0.05 µm in terms of arithmetic mean roughness Ra. When the surface roughness of the perforations 7 is less than 0.05 µm, yield of production of the print mask 6 may decrease.

Size of the perforation 7 may be, for example, 80 to 150 µm in length and 60 to 100 µm in width, but is preferably wider than a portion of the object of printing which is to be coated with the paste (for example, the barrier metal layer).

The print mask 6 is formed, in case it is made of Ni alloy, for example, by the additive process that is well known in the prior art, wherein a photosensitive resin is applied in a form of sheet, the photosensitive resin is patterned to remove portions other than those that correspond to the perforations 7 by employing the photolithography technology which is well known in the prior art, then the portions from which the photosensitive resin has been removed are coated with nickel plating by employing eletroplating or electroless plating process well known in the prior art, and removing the photosensitive resin.

The print mask 6 may also be made of polyimide resin. In this case, the print mask 6 is formed, for example, by applying a precursor of polyimide resin in the form of sheet by screen printing process, baking the sheet and forming holes that correspond to the perforations 7 by laser machining well known in the prior art.

While the print mask 6 may be formed by another manufacturing method, the additive process method can be applied to a fine pattern wherein the perforation 7 has a small area of 10000 µm$^2$ or less, and therefore the mask body is preferably made of Ni alloy, Cr alloy or the like.

Flip-chip Integrated Circuit

Figure 2:
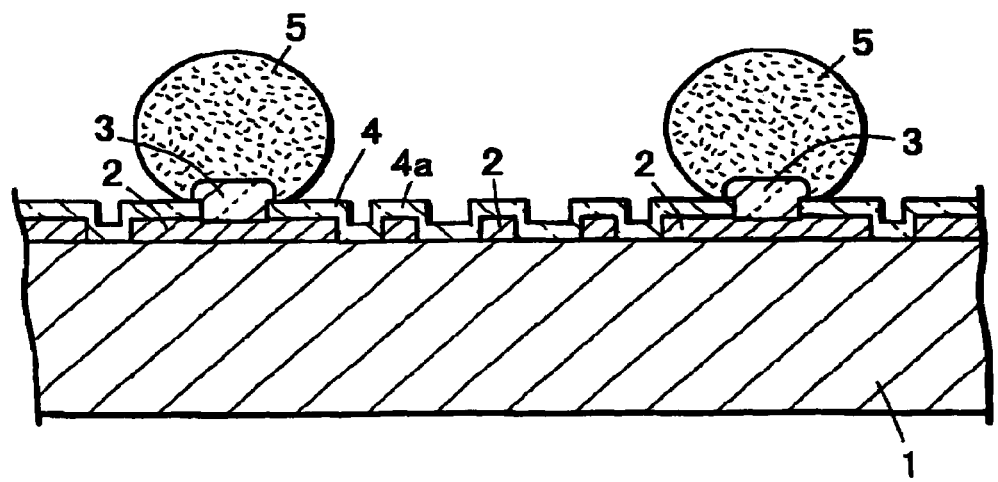
FIG. 2 is a sectional view of a flip-chip integrated circuit manufactured by a method of manufacturing the flip-chip integrated circuit according to one embodiment of the present invention.

The flip-chip integrated circuit shown in FIG. 2 wherein the bumps are formed by using the print mask 6 described above has such a constitution as the circuit pattern lines 2, the barrier metal layers 3, the passivation layer 4, the bumps 5, etc. are provided on the semiconductor wafer 1.

The semiconductor wafer 1 is made of a semiconductor material such as single crystal silicon and functions as a support base that supports semiconductor elements (not shown), the circuit pattern lines 2, the barrier metal layers 3, the passivation layer 4, etc. that are formed thereon.

The semiconductor wafer 1 is made by slicing a single crystal ingot formed by, for example, Czochralski method (pulling method) that is known in the prior art, into a plate having a predetermined thickness, polishing the surface of the plate and forming an insulating film over the entire surface of the plate by the thermal oxidation process known in the prior art.

The circuit pattern lines 2 provided on the semiconductor wafer 1 are formed from a metallic material such as aluminum (Al) or copper (Cu) with a thickness of 0.5 to 1.5 µm, and function as power feeder wires that supply electric power and electrical signals from the outside to the semiconductor elements not shown in the drawing. The circuit pattern lines 2 are formed in a predetermined pattern on the top surface of the semiconductor wafer 1 by a known process such as sputtering, photolithography or etching.

A plurality of barrier metal layers 3 are formed planar geometrically on part of the top surface of the circuit pattern lines 2 so as to be arranged in a straight line along the edge of the semiconductor wafer 1. Interposed between the adjacent barrier metal layers are part of the circuit pattern lines 2 in a direction perpendicular to the direction of arranging the barrier metal layers 3.

The barrier metal layers 3 are provided for the purpose of effectively preventing the erosion of the aluminum or the like that constitutes the circuit pattern lines 2 due to melting of the bumps 5 provided on the barrier metal layer 3, when the flip-chip integrated circuit is mounted on the circuit board. The barrier metal layers 3 are made in multi-layer structure of metals, with the top layer being made of a material that can be well wetted by the material making the bumps 5.

As such a multi-layer structure, three-layer structure of zinc (Zn), nickel (Ni) and gold (Au) stacked in this order from the side of the semiconductor wafer 1, for example, is used. Other possible structures include 2-layer structure of zinc (Zn) and nickel (Ni), three-layer structure of palladium (Pd), nickel (Ni) and gold (Au) and 2-layer structure of palladium (Pd) and nickel (Ni).

In the region of the wafer surface where the barrier metal layers 3 are not occupied, the passivation layer 4 is deposited made of an electrically insulating material such as silicon nitride ($Si_3N_4$), silicon oxide ($SiO_2$) or polyimide so as to cover the circuit pattern lines 2 and semiconductor elements not shown.

The barrier metal layers 3 are formed, after forming the passivation layer 4 on the wafer, on part of the top surface of the circuit pattern lines 2 where the passivation layer 4 has not been formed. In the case of three-layer structure of zinc (Zn), nickel (Ni) and gold (Au), zinc (Zn), nickel (Ni) and gold (Au) are deposited successively on part of the top surface of the circuit pattern lines 2 by a known process such as electroless plating, so as to form a cylindrical shape.

The passivation layer 4 satisfactorily protects the semiconductor devices and the circuit pattern lines 2 from air, so as to effectively prevent the semiconductor element and the circuit pattern lines 2 from being corroded through contact with moisture and other materials.

The passivation layer 4 has protrusion 4a, relief, protruding upward in a configuration corresponding to the thickness and profile of the circuit pattern lines 2 provided between the barrier metal layers 3, the protrusion 4a being disposed along the circuit pattern lines 2.

The passivation layer 4 is formed with a thickness of 0.5 to 3.0 μm on the top surface of the semiconductor wafer 1 by a known process such as sputtering, photolithography or etching.

Formed on the top surface of the barrier metal layers 3 are bumps 5 having spherical shape.

The bumps 5 are heated to melt when the flip-chip integrated circuit is mounted on the circuit board, so as to electrically and mechanically connect the barrier metal layers 3 of the flip-chip integrated circuit and the circuit pattern formed on the circuit board, and are formed from an electrically conductive material such as a solder made by mixing tin (Sn), silver (Ag) and copper (Cu) in proportions of 96.5: 3.0: 0.5 followed by melting and solidification, or silver epoxy.

Method of Manufacturing Flip-chip Integrated Circuit

Now a method of manufacturing the flip-chip integrated circuit will be described below.

(1) The semiconductor wafer 1 having the circuit pattern lines 2, the barrier metal layers 3 and the passivation layer 4 formed on the top surface thereof, the print mask 6 and paste are prepared. For the paste, an electrically conductive paste such as a solder paste made by mixing a large number of solder particles with a flux and other components and adjusted to obtain a predetermined viscosity, or silver epoxy is preferably used.

Figure 3:
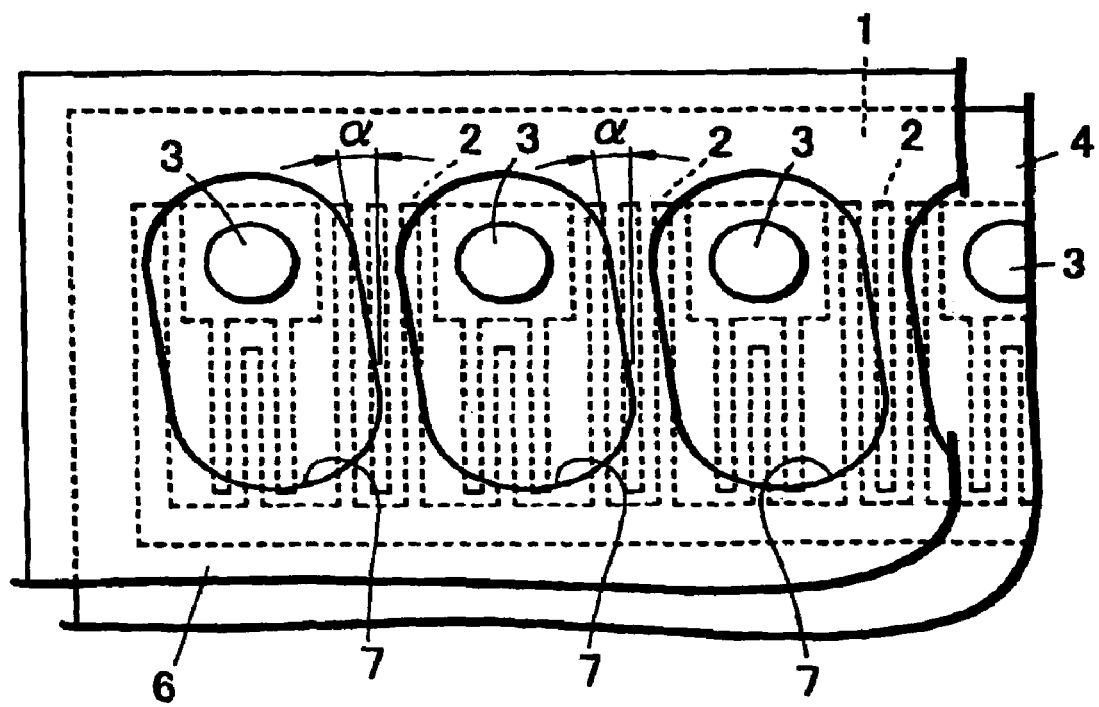
FIG. 3 is a plan view showing the positional relationship between a semiconductor wafer and the print mask placed thereon during manufacture of the flip-chip integrated circuit of FIG. 2.
Figure 4:
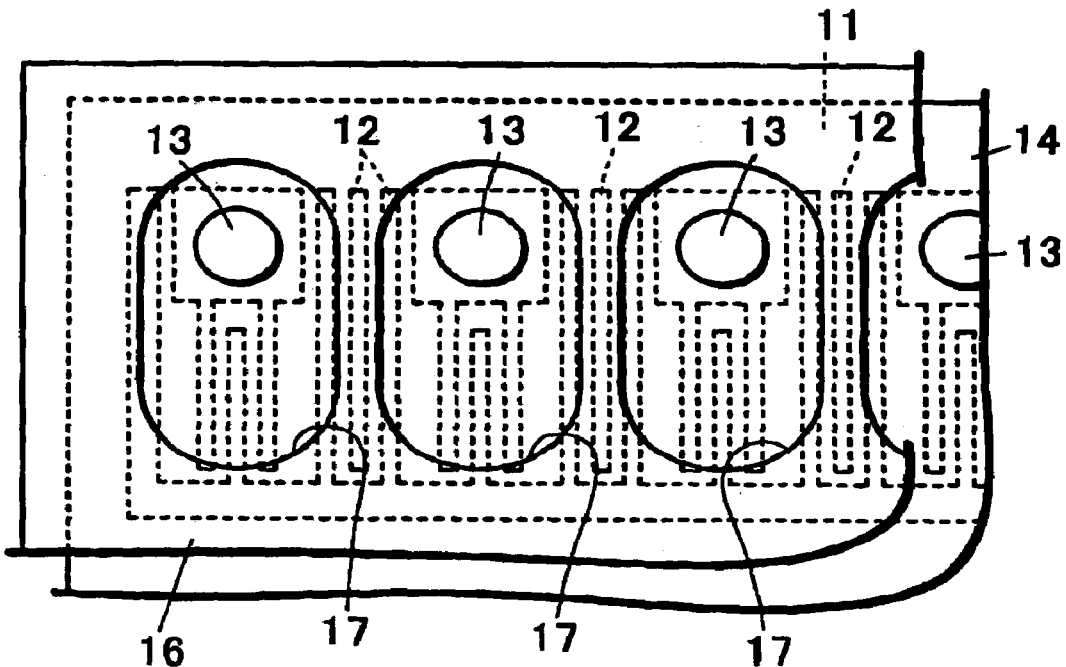
FIG. 4 is a plan view showing the positional relationship between a semiconductor wafer and the print mask placed thereon during manufacture of the flip-chip integrated circuit of the prior art.
Figure 5:
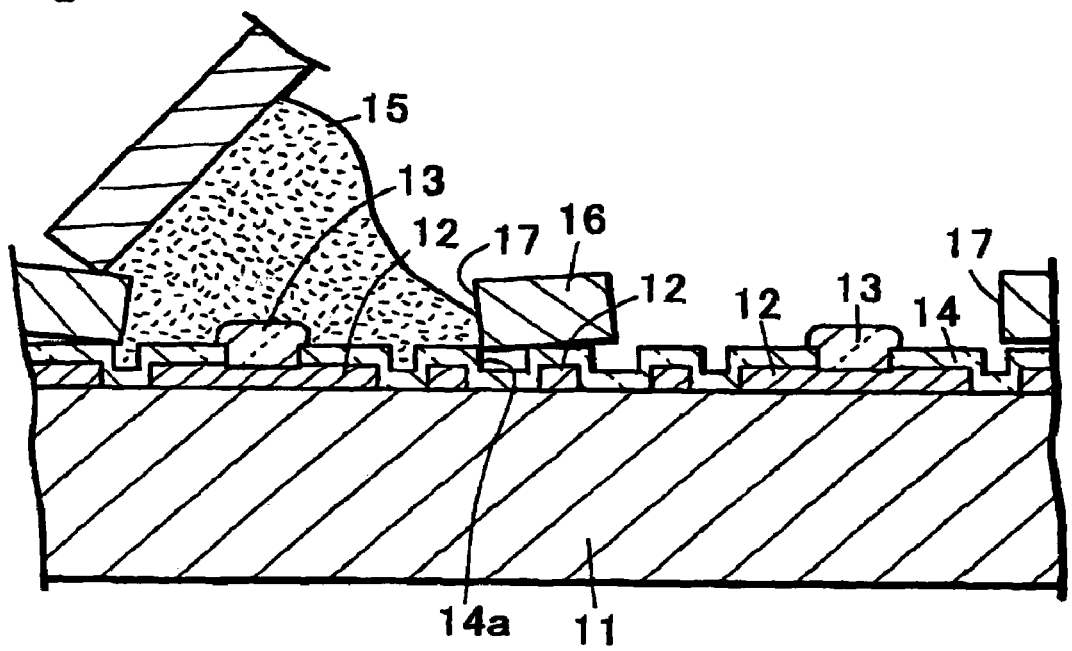
FIG. 5 shows a printing process of forming a solder paste for the flip-chip integrated circuit of the prior art.
Figure 6:
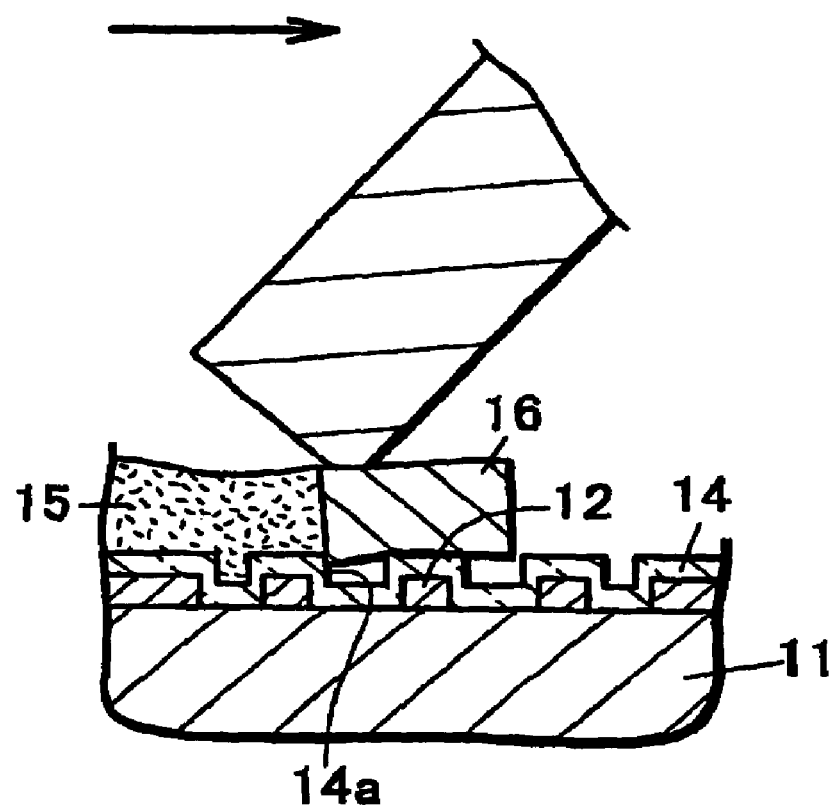
FIG. 6 shows a printing process of forming a solder paste for the flip-chip integrated circuit of the prior art.

(2) The print mask 6 is placed on or above the semiconductor wafer 1. While the print mask 6 is disposed so that the perforations 7 are positioned right above the corresponding barrier metal layers 3 provided on the semiconductor wafer 1, since the edges of the perforations along the longitudinal direction thereof are inclined with respect to the direction perpendicular to the direction of arranging the perforations 7, the edges of the perforations 7 are disposed to be inclined with respect to the circuit pattern lines 2 provided between the adjacent barrier metal layers 3 (refer to FIG. 3). As a result, the edges of the perforations 7 are inclined with respect to the protrusion 4a on the surface of the passivation layer, so that part of the edges of the perforations 7 is supported on the surface of the protrusion 4a.

(3) The paste is supplied onto the print mask 6, a squeegee or other pressing means (squeegee in this embodiment) is pressed against the print mask 6 and is moved so as to apply the paste via the perforations 7 onto the barrier metal layers 3. Although the print mask 6 is pressed by the pressing means such as the squeegee hard against the semiconductor wafer 1, since the edges of the perforations 7 along the longitudinal direction thereof are disposed to be inclined with respect to the circuit pattern lines 2 as described previously, part of the edges 71 of the perforations 7 are supported on the surface of the protrusion 4a so that such a trouble as most of the edges 71 of the perforations 7 eat into the corners in the vicinity of the protrusion 4a of the passivation layer 4 (corner between the side face of the protrusion 4a and the flat portion of the passivation layer 4) resulting in significant damage on the surface of the passivation layer 4 can be effectively prevented. Thus sealing performance of the passivation layer 4 is satisfactorily maintained and the problems including the erosion of the circuit pattern lines 2 can be solved.

The angle α of inclination of the edges 71 of the perforations 7 along the longitudinal direction thereof with respect to the circuit pattern lines 2 is preferably set in a range from 5 to 45°. When the angle α of inclination is less than 5°, the surface area of the protrusion 4a of the passivation layer 4 that supports the edges 71 of the perforations 7 becomes so small as to allow the surface of the passivation layer 4 to be damaged when the print mask 6 is pressed particularly hard against the semiconductor wafer 1. When the angle α of inclination is larger than 45°, patches of paste 5' located at adjacent areas become more likely to make contact with each other, thus making it difficult to arrange the perforations 7 with a high density. Thus angle α of inclination of the edges 71 of the perforations 7 with respect to the circuit pattern lines 2 is preferably set in a range from 5 to 45°, and more preferably set within 30° in view of high density arrangement of the perforations 7.

It is also preferable to incline the edges 71 of the perforations 7 with respect to the circuit connections 2 so as to support at least one of a pair of edges 71 of the perforations 7 along longitudinal direction thereof with at least two protrusions 4a, in order to prevent damage from being caused on the passivation layer 4. More preferably, the edges 71 of the perforations 7 is inclined with respect to the circuit pattern lines 2 so that both of the pair of edges 71 of the perforations 7 along the longitudinal direction thereof are each supported by at least two protrusions 4a.

(4) The paste applied onto the barrier metal layers 3 is dried, then melted so that the particles included in the paste fuse with each other, and is cooled so that spherical bumps 5 having substantially the same sizes are formed on the barrier metal layers 3.

According to the present invention, in the print mask having the plurality of elongated perforations are disposed therein, since the edges of the perforations along the longitudinal direction thereof is inclined with respect to the direction perpendicular to the direction of arranging the perforations, the edges of the perforations along the longitudinal direction thereof are disposed to be inclined with respect to the circuit pattern lines provided between the adjacent barrier metal layers when the print mask is placed on or above the semiconductor wafer that has the barrier metal layers which correspond to the perforations. As a result, such a trouble can be prevented from occurring, as the edges of the perforations of the print mask collide against the corners located at the bases of the protrusions of the passivation layer that is formed in correspondence to the configuration of the circuit pattern lines thereby to cause damage on the surface of the passivation layer, even when the print mask is pressed against the semiconductor wafer. Thus sealing performance of the passivation layer is satisfactorily maintained and the problems including the corrosion of the circuit pattern lines can be solved.

Figure 7:
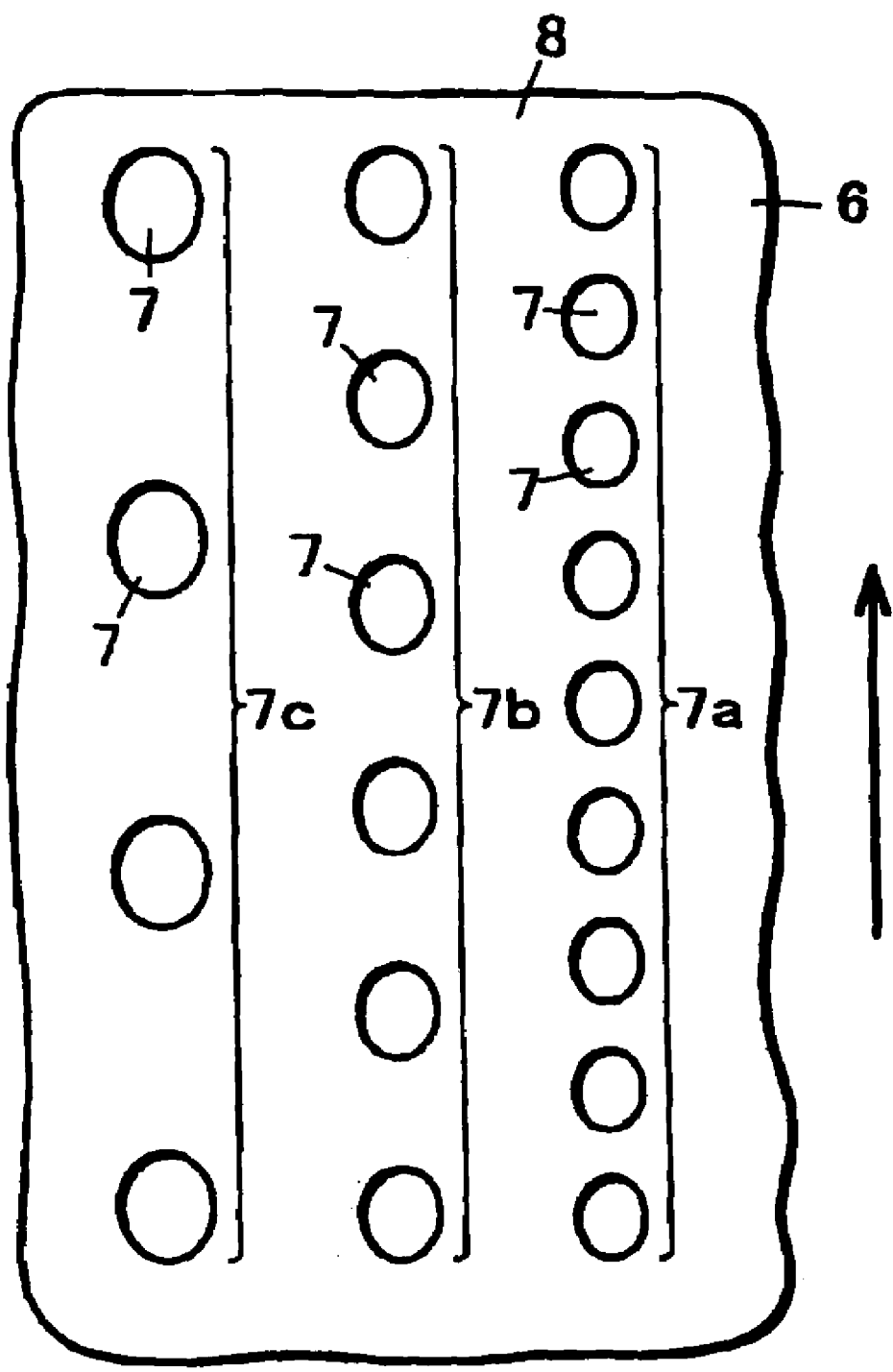
FIG. 7 is a plan view of a mask for screen printing according to one embodiment of the present invention.

In the second embodiment, the print mask 6 is made in a thin sheet, as shown in FIG. 7, from a metallic material such as aluminum, stainless steel or Ni alloy, or a synthetic resin. The print mask 6 has a thickness in a range from 20 to 80 μm, and a number of perforations (through holes) 7 are formed in a predetermined pattern in a metal sheet (mask body) 8.

In examples described below, the print mask 6 supports a printing paste such as solder paste 50 that is placed on the top surface thereof during screen printing operation.

The plurality of perforations 7 are provided for the purpose of applying the solder paste 50 placed on the metal sheet 8 onto the barrier metal layers located right below the perforations 7, and are formed so as to penetrate the metal sheet 8 in the direction of thickness thereof.

The plurality of perforations 7, each having various shapes such as circle, ellipse, elongated ellipse or polygon, are formed in a plurality of rows on the metal sheet 8 constituting a plurality of rows of perforations 7a, 7b and 7c.

In FIG. 7, the plurality of rows of perforations 7a, 7b, 7c are disposed substantially in parallel to each other and density of the perforations 7 is set individually for each of the plurality of rows of perforations 7a, 7b, 7c, with the density being different among the rows of perforations. In the illustrated embodiment, the density of the perforations are different among the rows of perforations.

What is important here is that the opening area of the plurality of perforations 7 is made smaller in a region of arrangement having higher density of arrangement of the perforations 7, i.e., in the row having larger perforation density. In case the density of arrangement of the perforations 7 is set at 80 to 90 dots per cm in the row of perforations 7a, 50 to 60 dots per cm in the row of perforations 7b and 10 to 15 dots per cm in the row of perforations 7c, for example, opening area of the perforation 7 is set at 7850 to 7950 μm$^2$ for the row of perforations 7a, 8400 to 8500 μm$^2$ for the row of perforations 7b and 8800 to 8900 μm$^2$ for the row of perforations 7c.

In consequence, when forming the solder bumps by using the mask for screen printing on the barrier metal layers provided on the circuit board, quantity of the solder paste 50 applied onto the barrier metal layers 8 can be made substantially equal among the rows of perforations 7a, 7b, 7c, even when the row of perforations 7a has higher density of arrangement of the perforations 7 than that near the row of perforations 7b, 7c, where the solder paste 50 located in the vicinity of the row of perforations 7a experiences vigorous rotation and flow of the solder paste itself on the mask resulting in lower viscosity than that of the solder paste 50 located in the vicinity of the row of perforations 7b, 7c as the solder paste 50 placed on the metal sheet 8 is moved by means of the squeegee. Therefore, the sizes of the solder bumps formed on the barrier metal layers of the electronic components can be equalized, and electronic components of high quality is provided.

Making all the perforations 7 in substantially similar shape has such an advantage as the shapes of the solder bumps can be made substantially the same in all the rows of perforations 7a, 7b, 7c.

The metal sheet 8 and the plurality of perforations 7 may be formed by employing the additive process which is known in the prior art in case the metal sheet 8 is made of an Ni alloy.

Now a method of forming the solder bumps of electronic components using the mask for screen printing described above will be described in detail below with reference to FIG. 8A and FIG. 8B, by taking a flip-chip IC as an example.

Figure 8:
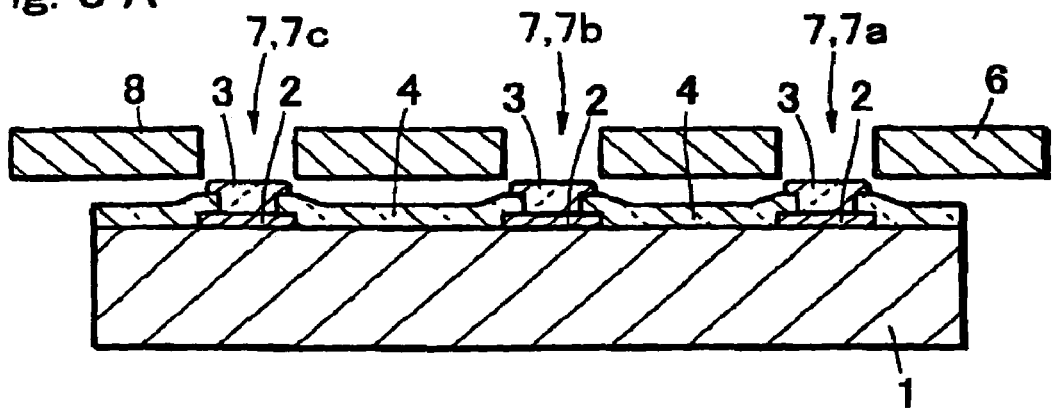
FIG. 8A through 8C show processes of forming solder bumps on barrier metal layers of a flip-chip IC using the mask for screen printing shown in FIG. 1.
Figure 8:
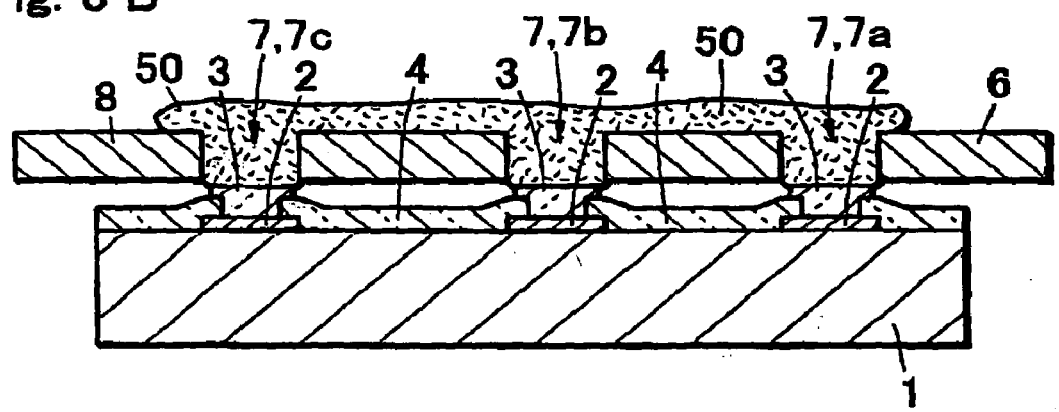
Figure 8:
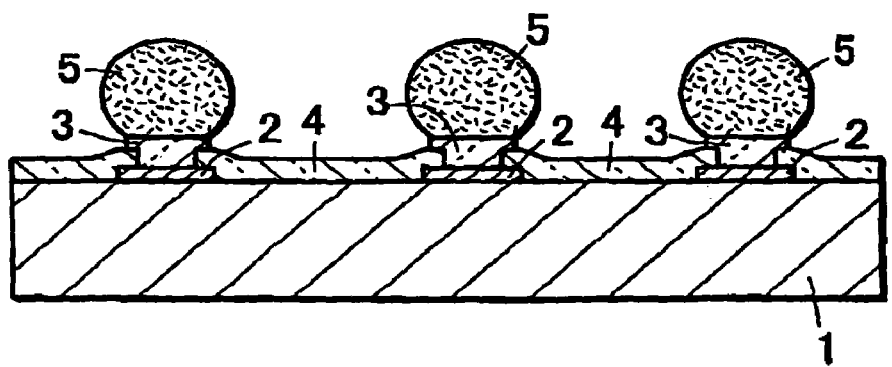

(1) First, with reference to FIG. 8A, a substrate a wafer 1 as the object of printing, the solder paste 50 and the screen-print mask 6 are prepared. The substrate 1 has the circuit pattern 2 made of aluminum or other material, semiconductor elements and the like packaged with a high density on one principal surface of a plate made of single crystal silicon or the like, while a number of barrier metal layers 3 are formed on the circuit pattern 2 and the passivation layer 4 is formed on a region where the barrier metal layers 3 are not formed. The plurality of barrier metal layers 3 are formed with a density that is predetermined individually for each rows and in one-to-one correspondence to the perforations 7 of the screen-print mask 6, each of which made in three-layer structure of zinc (Zn), nickel (Ni) and gold (Au) stacked in this order and the passivation layer 4 is formed from an electrically insulating material such as silicon nitride ($Si_3N_4$) in the region where the barrier metal layers 3 are not formed, as described previously. The barrier metal layer 3 maybe formed by the known electroless plating process, and the passivation layer 4 may be formed in a predetermined pattern by a known process such as sputtering, photolithography or etching. For the solder paste 50, one made by mixing a large number of solder particles with a flux and other components and adjusted to obtain a predetermined viscosity is preferably used.

(2) The substrate 1 is placed and fixed on a stage of a screen printing apparatus, and the screen-print mask 6 prepared in step (1) is aligned with the substrate 1 (FIG. 8A). The screen-print mask 6 is placed so that the plurality of perforations 7 are located right above the corresponding barrier metal layers 3 provided on the substrate 1.

(3) Then as shown in FIG. 8B, the solder paste 50 prepared in step (1) and the squeegee are placed on the screen-print mask 6, the squeegee is moved across the rows of perforations 7a, 7b, 7c with the squeegee pressed against the screen-print mask 6 so that the edge of the squeegee makes contact with the mask, thereby to apply the solder paste 50 via the perforations 7 of the screen-print mask 6 onto the barrier metal layers 3 and carry out printing. At this time, since the perforations 7 of the screen-print mask 6 are formed so that the opening area of the perforation 7 is made smaller in a region of arrangement having higher density of arrangement of the perforations, quantity of the solder paste 50 applied onto the barrier metal layers can be made substantially equal among the rows of perforations 7a, 7b, 7c, even when the solder paste 50 located in the vicinity of the row of perforations 7a having higher density of arrangement of the perforations than that near the row of perforations 7b, 7c experiences vigorous rotation and flow of the solder paste on the mask resulting in lower viscosity than that of the solder paste 50 located in the vicinity of the row of perforations 7b, 7c.

(4) Then as shown in FIG. 8C, the solder paste 50 applied to the barrier metal layers 3 is dried, and then reflowed so that the solder particles included in the solder paste 50 melt and fuse with each other, and is cooled so that spherical solder bumps 5 having substantially the same sizes are formed on the barrier metal layers 3.

Figure 9:
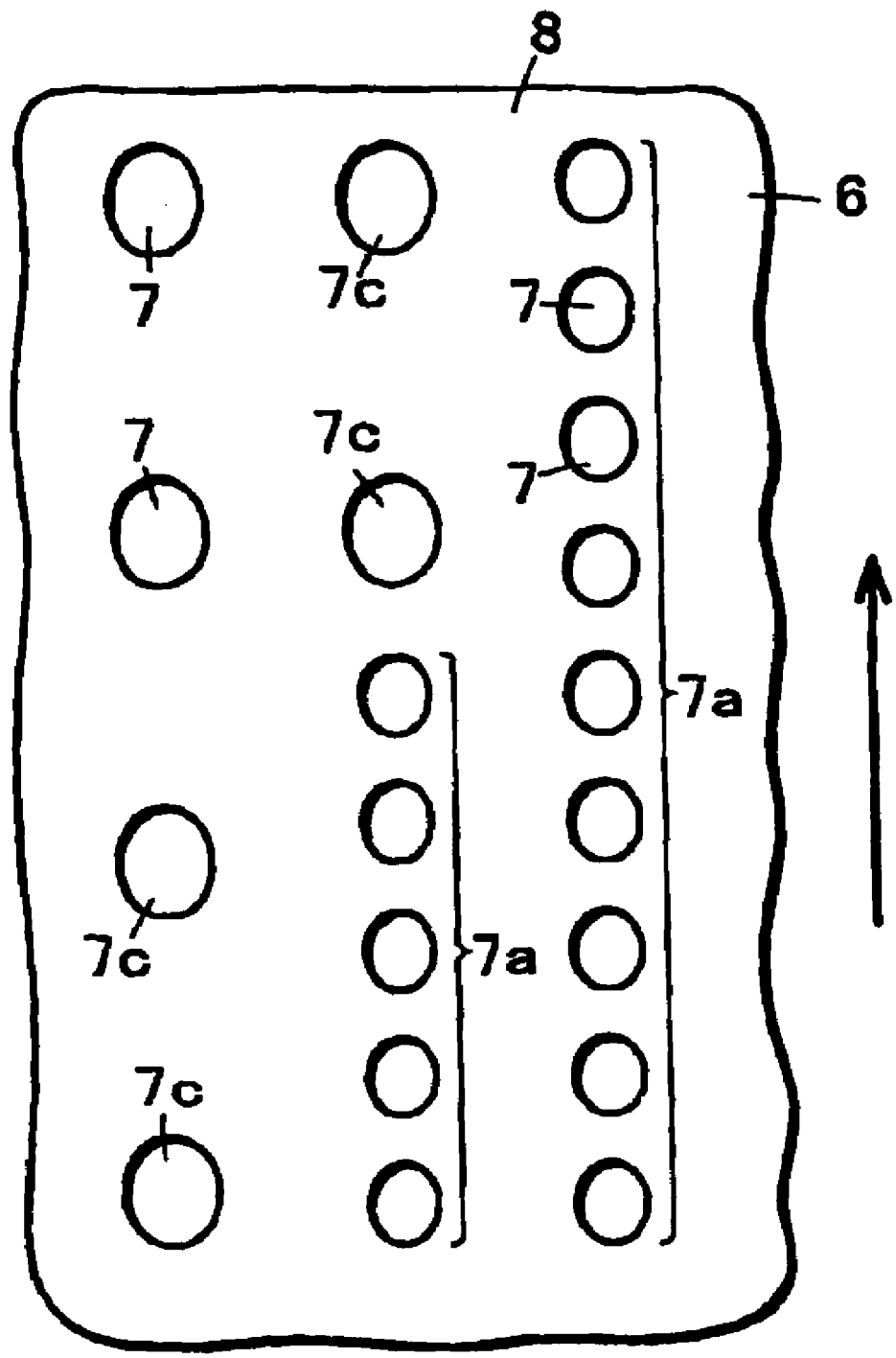
FIG. 9 is a plan view of a mask for screen printing according to another embodiment of the present invention.
Figure 10:
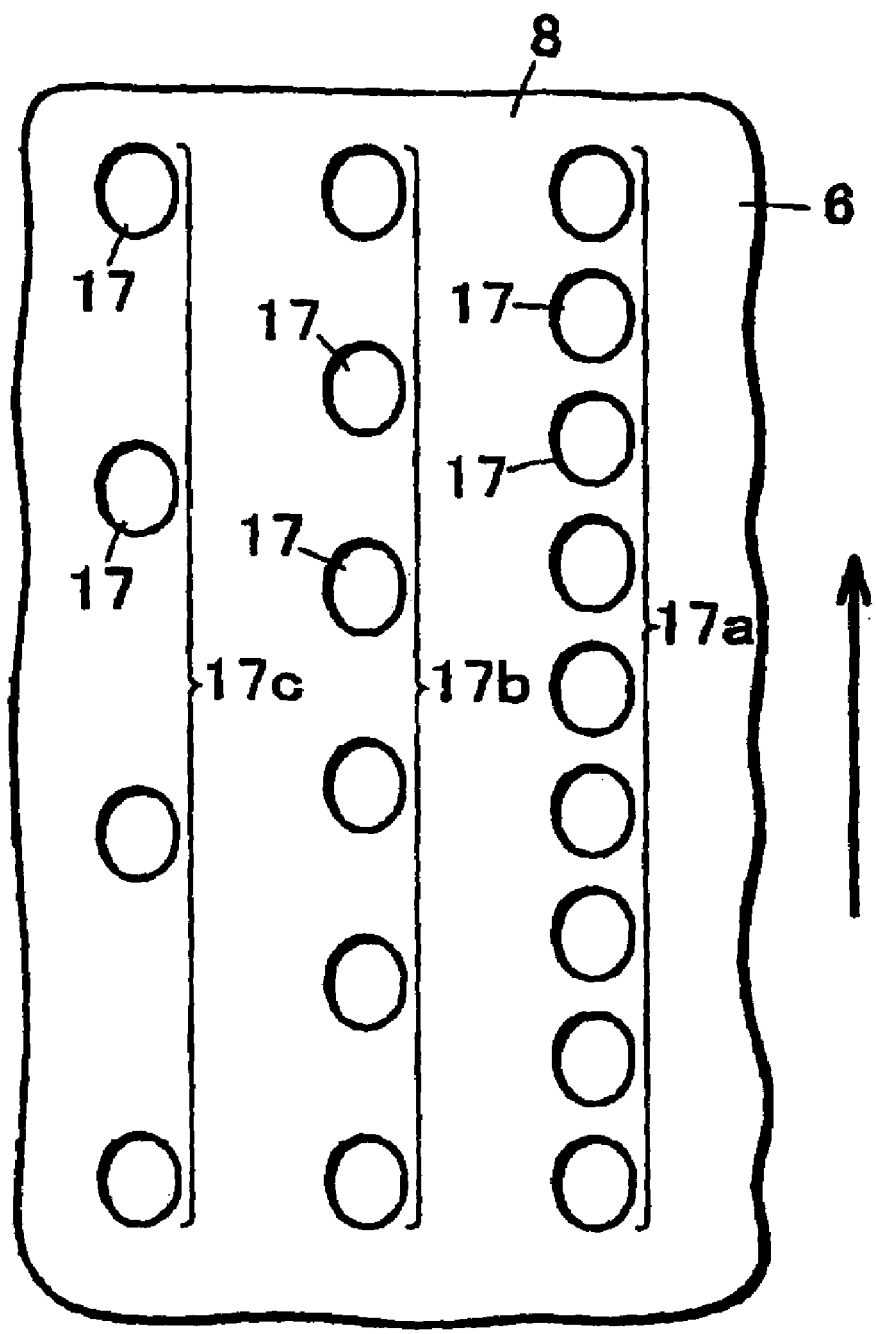
FIG. 10 is a plan view of a mask for screen printing of the prior art.

In this embodiment, the density of arrangement of the perforations may be varied within a row of perforations. In this case, too, an opening area of perforation is set to be smaller in the region having higher density of arrangement of perforations as shown in FIG. 9. This makes it possible to make the quantity of the solder paste 50 applied onto the barrier metal layers 3 substantially equal among all the perforations 7, thus making the sizes of the solder bumps formed on the barrier metal layers 3 of the electronic components equal.

The print mask may be made of a resin such as polyimide, polyester or polyethylene, instead of the metal sheet 8 having a number of perforations 7 formed therein.

In another embodiment, the invention can be applied to, besides the formation of the solder bumps of the flip-chip IC, formation of solder bumps provided on other electronic components such as resistor and capacitor.

For the printing paste, other electrically conductive paste such as silver paste may be used in addition to the solder paste 50, to which bump electrode can be formed.

In the embodiments described above, forming the perforations 7 in oval or elongated elliptic shape with the longitudinal direction thereof disposed perpendicular to the moving direction of the squeegee has such an advantage that very precise quantity of the solder paste can be applied onto the barrier metal layers.

According to the present invention, as described above, since the opening area of the perforations formed in the mask for screen printing is set smaller in a region where the density of arrangement of the perforations is higher, quantity of the printing paste applied onto the barrier metal layers can be made substantially equal among all the perforations even when viscosity of the printing paste is decreased in the vicinity of a region where the density of arrangement of the perforations is higher, thus making the sizes of the bumps formed on the barrier metal layers of the electronic components equal so that high quality electronic components can be obtained.

It is understood that scope of the present invention is not limited to the embodiments described above, and various modifications and improvements can be made without deviating from the scope and spirit of the claims of the present invention.

What is claimed is:

1. A print mask used to form bumps on barrier metal layers of a wafer comprising a plurality of perforations, in a plan view, each elongated and disposed in linear arrangement for applying a paste via the perforations onto an object of printing,
    wherein each of said perforation includes an edge disposed along the longitudinal direction in a plan view, said edge being inclined with respect to the direction perpendicular to the direction of arranging the perforations.

2. The print mask according to claim 1, wherein the edge of said perforation disposed along the longitudinal direction thereof is substantially straight.

3. The print mask according to claim 1, wherein the edge disposed along the longitudinal direction of said perforations is inclined by an angle from 5 to 45° from the direction perpendicular to the direction of arranging said perforations.

4. A print mask comprising a number of perforations disposed in a single row or a plurality of rows for applying and printing a printing paste via the perforations onto aware so as to form bumps on barrier metal layers provided on the wafer,
    wherein the density of arrangement of said perforations is set differently from region to region within the arrangement and the opening area of said perforation is set smaller in the region of an arrangement where the density of arrangement of said perforations is higher.

5. The print mask according to claim 4, wherein said perforations are disposed in a plurality of rows and the density of said perforations is set individually for each row.

6. The print mask according to claim 5, wherein the rows of said perforations are disposed substantially in parallel to each other.

* * * * *